(12) United States Patent
Nakao et al.

(10) Patent No.: US 6,469,648 B2
(45) Date of Patent: Oct. 22, 2002

(54) DIGITAL-TO ANALOG-CONVERTING METHOD AND DIGITAL-TO ANALOG CONVERTER EMPLOYING COMMON WEIGHT GENERATING ELEMENTS

(75) Inventors: Shigetoshi Nakao, Tokyo; Toshihiko Hamasaki, Yokohama, both of (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/805,260

(22) Filed: Mar. 13, 2001

(65) Prior Publication Data

US 2001/0026234 A1 Oct. 4, 2001

(30) Foreign Application Priority Data

Mar. 16, 2000 (JP) ........................................ 2000-073712

(51) Int. Cl.$^7$ ............................. H03M 1/80; H03M 3/00
(52) U.S. Cl. ........................................ 341/153; 341/143
(58) Field of Search ................................. 341/144, 145, 341/143, 118, 120, 150, 153; 706/26, 43

(56) References Cited

U.S. PATENT DOCUMENTS

| | | | | |
|---|---|---|---|---|
| 4,528,551 A | * | 7/1985 | Agrawal et al. | 341/143 |
| 5,017,918 A | | 5/1991 | Matsusako | 341/118 |
| 5,396,245 A | * | 3/1995 | Rempfer | 341/145 |
| 5,768,478 A | * | 6/1998 | Batten | 706/43 |

FOREIGN PATENT DOCUMENTS

WO 99/44289 * 9/1999

OTHER PUBLICATIONS

"A Multi–Bit ΔΣ Audio DAC with 120dB Dynamic Range" by Fujimori et al, 1999 IEEE International Solid–State Circuits Conference, 6/99, pp. 152–153.

"112–dB SNR Oversampling DAC with Segmented Noise–Shaped Scrambling" by Adams et al., Audio Engineering Society 105th Convention, Sep. 26–29, 1998, pp. 1–4, Figs. 1–13.

"A 3V 22mW Multi–bit Current Mode ΣΔ DAC with 100 dB Dynamic Range" by Shinohara et al., 1996 IEEE International Solid–State Circuits Conference, pp. 234–235.

* cited by examiner

Primary Examiner—Patrick Wamsley
(74) Attorney, Agent, or Firm—W. Daniel Swayze, Jr.; W. James Brady; Frederick J. Telecky, Jr.

(57) ABSTRACT

A digital-to-analog converter is provided for accomplishing analog output characteristics using different digital-to-analog conversion type digital signal processing schemes. A plurality of bits of a received digital signal are divided into a plurality of bit groups. A digital signal processing unit includes a plurality of bit group digital signal processors for receiving the plurality of bit groups. The plurality of digital signal processors employ one or more digital-to-analog conversion type digital signal processing schemes for generating a plurality of digital signal processed outputs. The converter adds the plurality of digital signal processed outputs to generate a composite signal processed output, and includes a weight generating unit for controlling a plurality of shared weight generating elements in response to the composite digital signal processed output to generate an analog output signal.

18 Claims, 7 Drawing Sheets

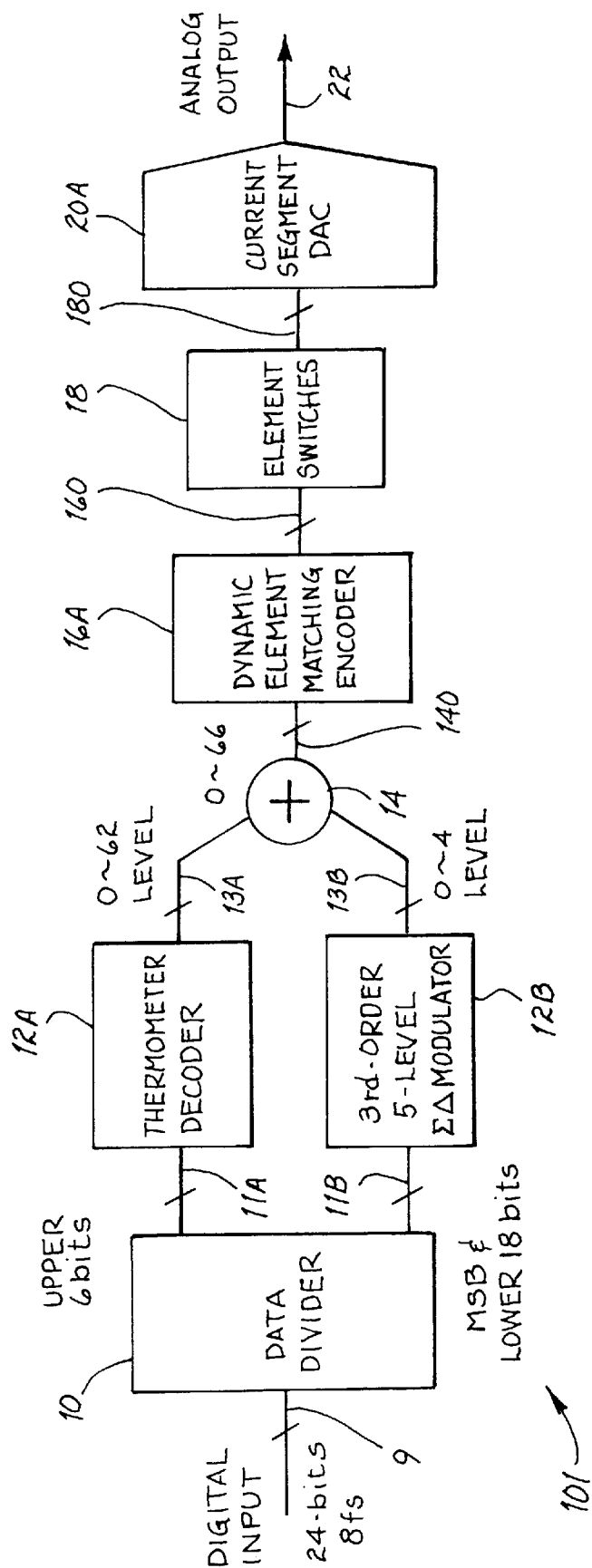
FIG. 3A PARALLEL INPUT MODE

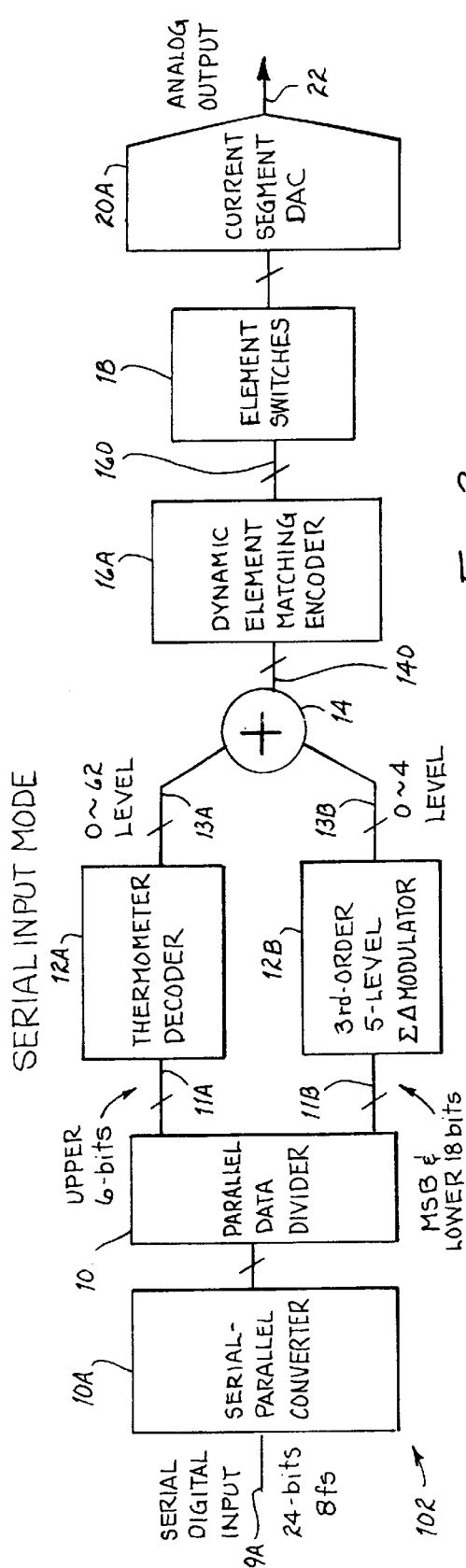
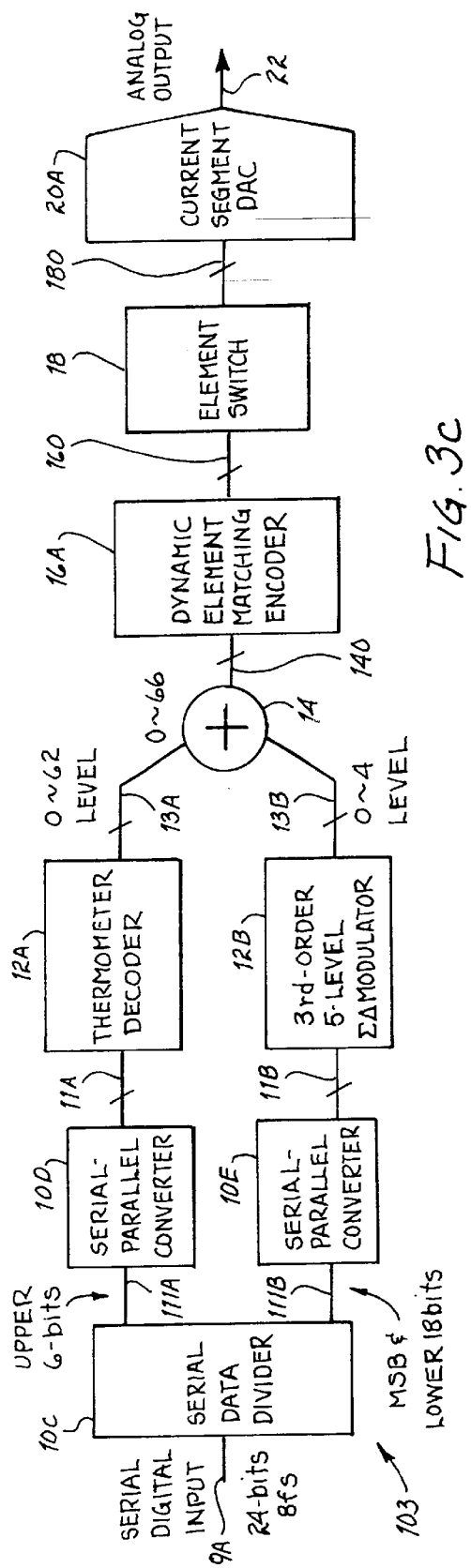
FIG. 3B
FIG. 3C

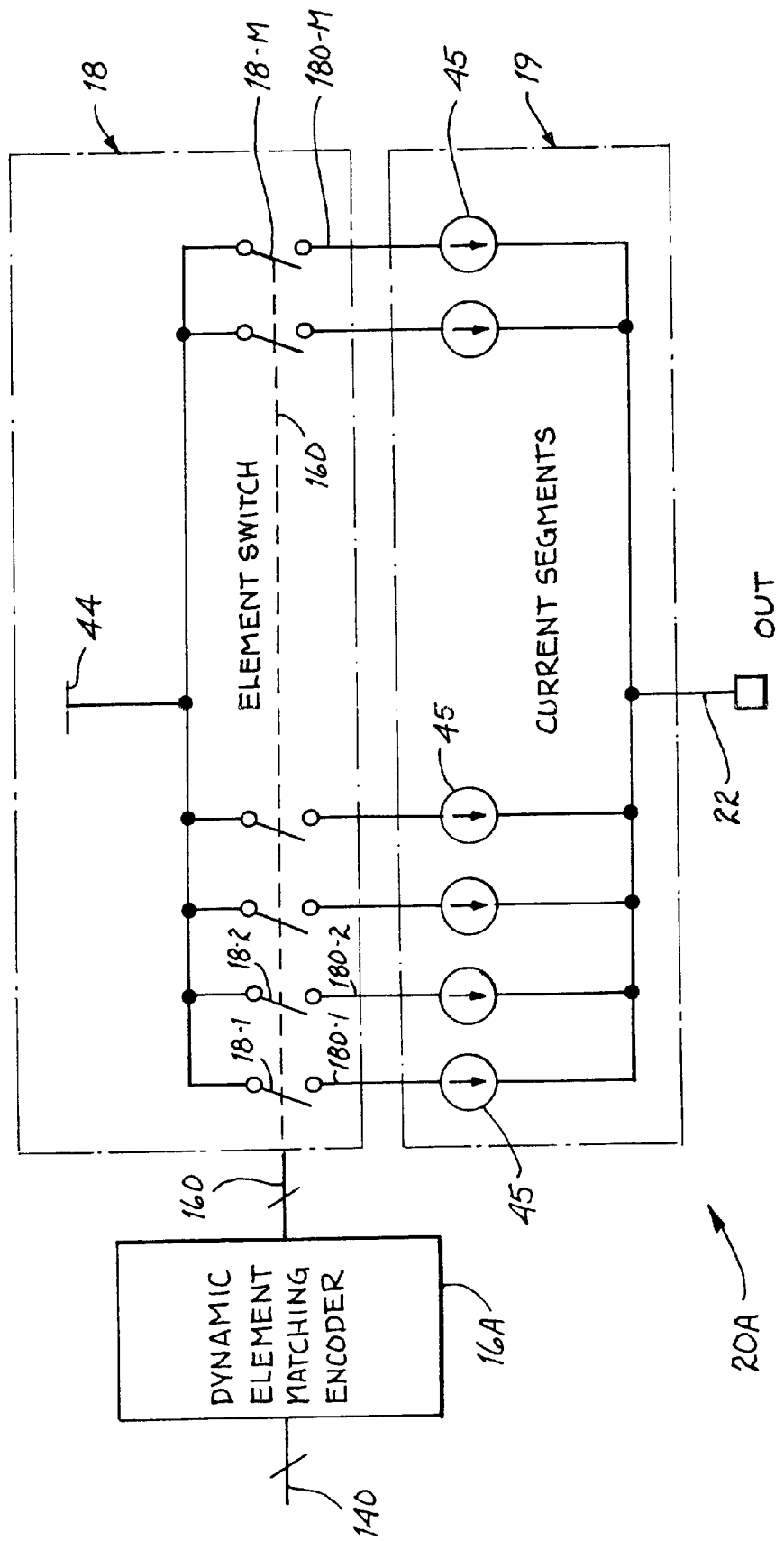
Fig. 4  SEGMENTED DAC TOPOLOGY

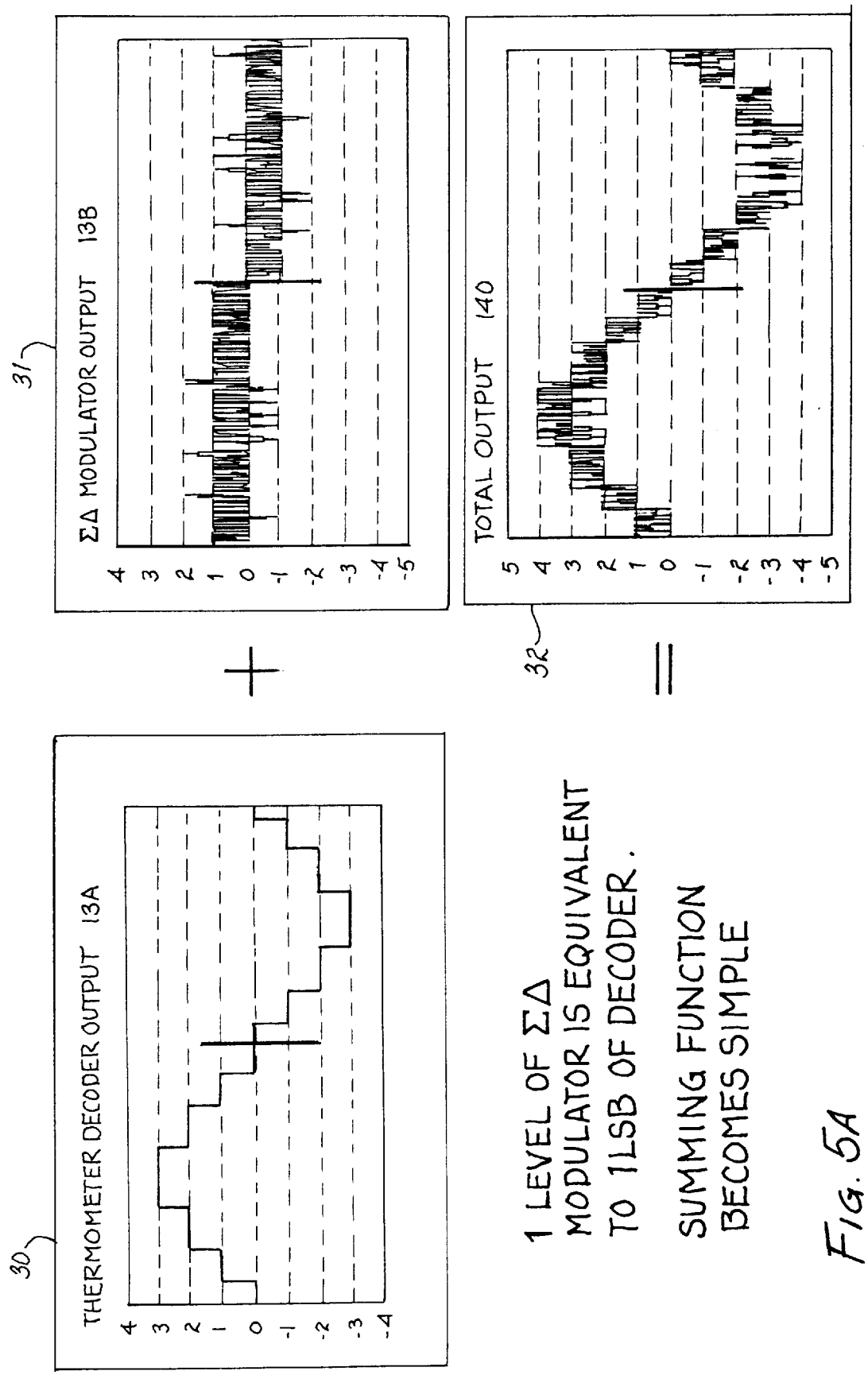
FIG. 5A SUMMING DATA IN DIGITAL DOMAIN

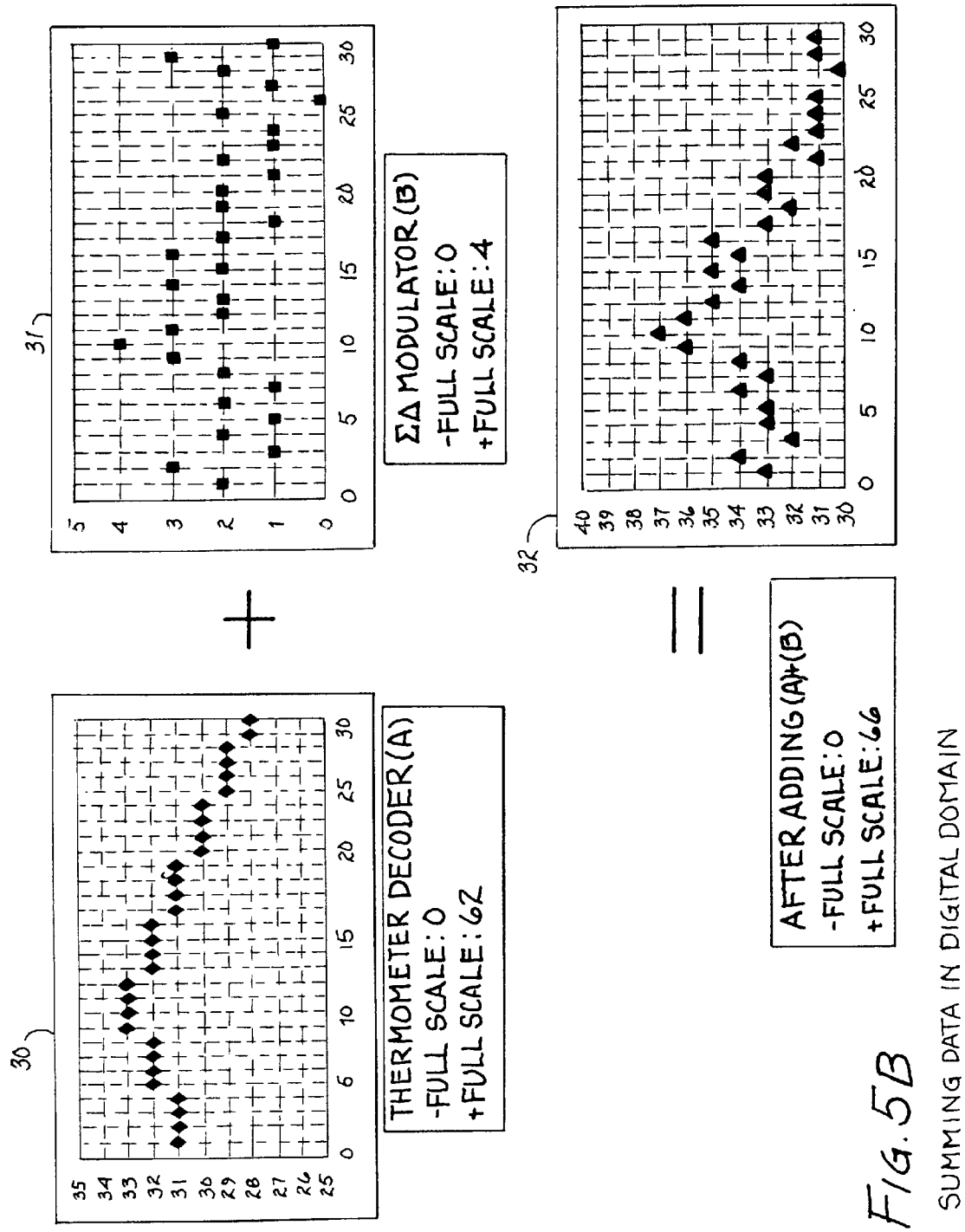
FIG. 5B  SUMMING DATA IN DIGITAL DOMAIN

DIGITAL-TO ANALOG-CONVERTING METHOD AND DIGITAL-TO ANALOG CONVERTER EMPLOYING COMMON WEIGHT GENERATING ELEMENTS

BACKGROUND OF THE INVENTION

The present invention relates generally to digital-to-analog conversion for converting a digital input signal to an analog output signal, and more particularly to a method and apparatus for implementing the digital-to-analog conversion using a plurality of conversion schemes.

A variety of approaches have been proposed for the digital-to-analog conversion. For example, such approaches include a so-called multi-bit scheme which converts a binary-weighted M-bit digital signal input to an analog signal using converting elements that weight the digital signal input with binary weights, and a one-bit scheme using a delta-sigma modulator which has been rapidly widespread due to a higher digital signal processing speed resulting from the advance of recent semiconductor integrated circuit technologies. While these schemes may be further subdivided according to a difference in electric. circuit connection of the converting elements or a difference in the type of the converting elements, the digital-to-analog conversion is basically classified into the two schemes. The multi-bit scheme is characterized by a high signal-to-noise (SN) ratio resulting from the absence of special digital circuits. However, if the converting element composed of semiconductor integrated circuits does not provide a sufficient relative accuracy, the multi-bit scheme has problems in the linearity of level and deteriorated distortions, in which case, the accuracy must be improved through a trimming technique, leading to a tendency to a higher cost.

On the other hand, the one-bit scheme can provide high linearity by oversampling a digital signal at a high signal processing frequency relative to a signal band to move quantization noise of a one-bit signal to the outside of a required band. However, since the one-bit scheme processes a digital signal at a high frequency as mentioned, it is difficult to achieve a high SN ratio when this scheme is implemented by semiconductor integrated circuits.

Thus, a digital-to-analog converter referred to as an advanced onebit scheme has been proposed as a composite multi-bit and one-bit scheme for canceling the drawbacks of the two schemes. This converter separates a 16-bit binary digital signal into two signal groups consisting of upper bits and lower bits. A multi-bit converter of a resistor ladder type employing a trimmed resistor converting element is used for the upper bits, while a one-bit signal converter employing the delta-sigma scheme is used for the lower bits, and a final analog output unit is provided to combine analog outputs of the two converters. A digital-to-analog converter for PCM audio implemented by this advanced one-bit scheme has accomplished high performance with the SN ratio as high as 110 dB.

The advanced one-bit scheme, however, is disadvantageous in that the reference levels of the respective converters for the analog outputs differ slightly from each other due to errors involved in the manufacturing of integrated circuits. Therefore, when the analog signals of the respective converters are combined, distortion will occur at a combination point due to a relative error of the reference levels to degrade the entire analog output characteristics.

As described above, a digital-to-analog converter composed of a plurality of converters suffers from a relative error of one converter to another.

SUMMARY OF THE INVENTION

It is therefore an object of the present invention to provide a digital-to-analog converter which is capable of reducing the above mentioned relative error between analog outputs of the multi-bit converter and the onebit signal converter of the above mentioned advanced one-bit scheme to accomplish highly accurate analog output characteristics.

It is another object of the present invention to provide a method and apparatus for realizing a highly accurate digital-to-analog conversion by using two or more digital-to-analog (D/A) conversion type digital signal processing schemes in the digital-to-analog conversion.

It is a further object of the present invention to provide a method and apparatus for use with two or more mutually different D/A conversion schemes, which are capable of reducing relative errors among outputs lresulting from the respective conversion schemes.

To achieve the above objects, a digital-to-analog converting method for generating an analog output signal representative of a received digital input signal comprised of a plurality of bits in accordance with the present invention comprises the steps of forming a plurality of bit groups from the plurality of bits of the digital input signal; processing each of the plurality of bit groups using at least one predetermined digital-to-analog conversion type digital signal processing scheme to generate a weight generation control output, so that a plurality of weight generation control outputs are generated for the plurality of bit groups; digitally adding the plurality of weight generation control output to generate a composite weight generation control output; and controlling, by means of combination switches for the weight generating elements, a plurality of weight generating elements in response to the composite weight generation control output to generate an analog output signal representative of the digital input signal. According to the present invention, the digital-to-analog converting method may further include the step of digitally processing the composite weight generation control output by means of encoding logic in order to accomplish the dynamic element averaging for producing the control output.

Also, a digital-to-analog converter for generating an analog output signal from a received digital input signal comprised of a plurality of bits in accordance with the present invention comprises dividing means for forming the plurality of bits of the digital input signal into a plurality of bit groups; a plurality of bit group weight generation control means coupled to receive the plurality of bit groups, respectively, where each of the plurality of weight generation control means processes the bit group associated therewith using a predetermined digital-to-analog conversion type digital signal processing scheme to generate a weight generation control output, so that a plurality of the weight generation control outputs are generated; adder means for digitally adding the plurality of weight generation control outputs to generate a composite weight generation control outputs; and weight generating means including a plurality of weight generating elements for controlling the plurality of weight generating elements in response to the composite weight generation control output to generate an analog output signal representative of the digital input signal.

Also, according to the present invention, the converter may further include digital signal processing means for digitally processing the composite weight generation control output.

Further, a digital-to-analog converter in accordance with the present invention converts a digital signal to an analog signal by a combination of a first digital signal processing unit for separating a digital signal input sequence weighted according to the digit by at least one or more arbitrary digits to produce K digital signal input sequences (for example, by separating a serial digital signal input weighted according to the digit (column), by at least one or more arbitrary digits to produce K serial digital signal inputs, for example, by separating 10001111000011110000001 into 1000 1111 0000111 110000001, wherein K=4); a second digital signal processing unit including a plurality of means for digitally processing the K separated digital signal input sequences to convert the K separated digital signal input sequences to K second digital signal groups representative of levels of the K separated digital signal input sequences associated therewith; a third digital signal processing unit for converting the K second digital signal groups to a third digital signal group representative of a level; and a group of digital-to-analog converting elements comprised of a plurality of N substantially equivalent weight generating elements for an M-bit output of the third digital signal group representative of the level.

According to the present invention, the group of analog-to-digital converting elements comprised of substantially equivalent weight generating elements for an M-bit output of the third digital signal group may include the number N of converting elements which is equal to or larger than M. Further, according to the present invention, the third digital signal processing unit has a function of averaging the digital-to-analog converting elements with respect to a time axis.

Furthermore, according to the present invention, the second digital signal processing unit for converting to K second digital signal groups may linclude at least one sigma-delta conversion digital signal processor.

BRIEF DESCRIPTION OF THE DRAWINGS

FIG. 3A is a block diagram of a parallel input mode implementation of the digital-to-analog converter of FIG. 2.

FIGS. 3B and 3C are block diagrams of serial input mode implementations of the digital-to-analog converter of FIG. 2.

FIG. 4 is a block diagram of a segmented DAC used in the implementations of FIGS. 2, 3A,3B, and 3C.

FIGS. 5A and 5B are graphs illustrating operation of the digital-to,I lanalog converter of the present invention.

DETAILED DESCRIPTION OF THE INVENTION

Figure 1:
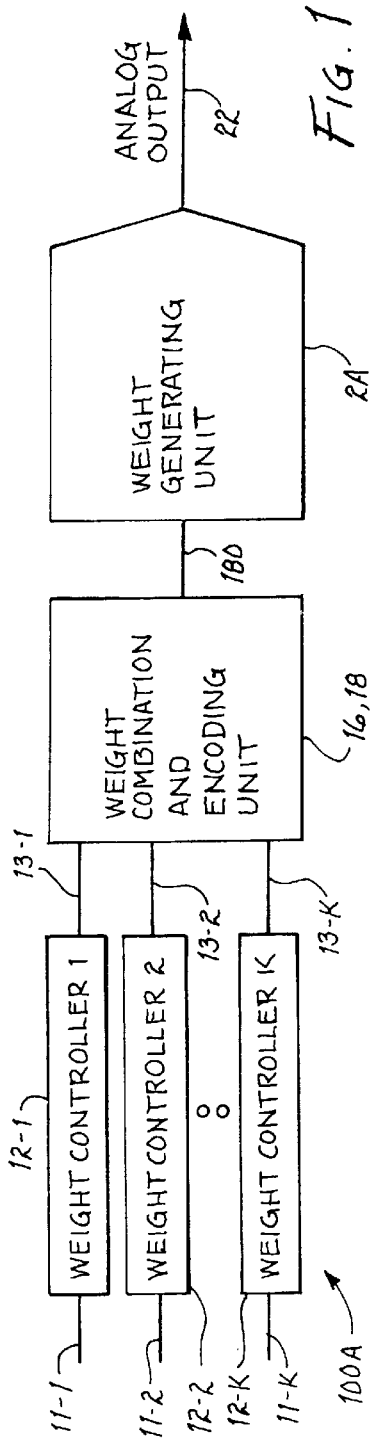
FIG. 1 is a block diagram illustrating the configuration of a digitalto-analog converter according to a first embodiment of the present invention.
Figure 2:
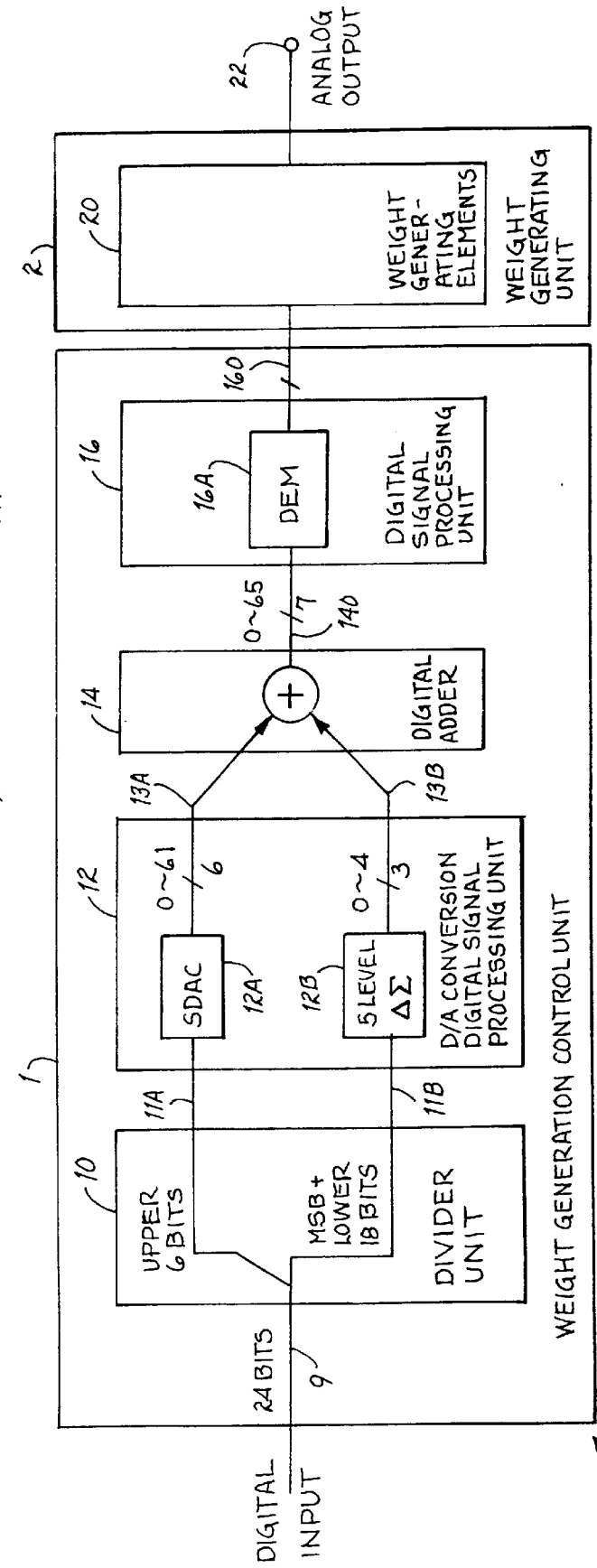
FIG. 2 is a block diagram illustrating the configuration of a digitalto-analog converter according to a second embodiment of the present invention.

FIG. 1 illustrates a fimdamental concept of a digital-to-analog converter (D/A converter), and will be described after FIG. 2 is described.

FIG. 2 illustrates a digital-to-analog converter (D/A converter) 100 which receives a digital signal 9 comprised of a plurality of bits. The illustrated converter comprises a digital circuit section 1 for performing digital processing or "weight generating control", and an analog circuit section 2 for performing analog processing or "weight generation". The digital circuit section 1 includes a divider unit 10 for dividing a plurality of bits of a received digital signal 9 into a plurality of bit groups (which may mutually have overlapping portions), and a digital-to-analog signal processing unit 12 including a plurality of bit group digital signal processors 12A and 12B for receiving the plurality of bit groups, respectively. (Several implementations of divider unit 10 for parallel input mode operation and serial input mode operation are shown and subsequently described in FIGS. 3A, 3B and 3C.)

The plurality of digital signal processors 12A,B rely on mutually identical or mutually different digital-to-analog conversion digital signal processing schemes to generate a plurality of digital signal processed outputs 13A and 13B. The digital circuit section 10 further comprises an adder 14 for digitally adding the plurality of digital signal processed outputs 13A and 13B to generate a composite or "combined digital signal processed output" 140. The digital signal processing unit 16 digitally processes the "combined digital signal processed output" 140.

An "average processing circuit" 16A contained in digital signal processing unit 16 performs Dynamic Element Matching (DEM) for averaging the digital output 140 of the adder 14. The output produced on conductors 160 by the average processing circuit 16A is supplied to weight generators 20 which are included in a weight generating unit 2 for generating an analog output 22 corresponding to the digital input 9. Subsequently described FIG. 4 illustrates the structure of the weight generating elements 20 and weight generating unit 2 and any additional control signals that are generated in weight generation control unit I for controlling weight generating unit 2.

In analog-to-digital converter 100 of FIG. 2, the upper (most significant) six bits 11A are processed by the segment conversion (SDAC) digital signal processor 12A to provide a total of 64 levels, and the remaining lower (less significant) bits 11B are digitally processed by a five-level $\Delta\Sigma$ conversion type digital signal processor 12B.

Digital-to-analog converter 100 also includes five-level $\Delta\Sigma$ conversion type digital signal processor 12B for the MSB and lower 18 bits of 24-bit digital input word 9. In audio data, the term "MSB" expresses the plus-minus (+/−) sign, and therefore this MSB bit is also needed for sigma delta conversion type digital signal processors.

FIGS. 5A and 5B show the output value of the output signal 140 obtained by summing the output 13A of thermometer decoder 12A and the output 13B of five level $\Delta\Sigma$ modulator 12B.

The 5 level $\Delta\Sigma$ modulator 12B is described in "A-3V, 22 mW Multibit Current Mode DS DAC with 100 dB Dynamic Range", IEEE J. of Solid State Circuits, Volume 31, Number 12, pp. 1888–1894, 1996, which is incorporated herein by reference. In order to match "relative levels" of the SDAC digital signal processor and the $\Delta\Sigma$ digital signal processor, the feedback gain of the $\Delta\Sigma$ digital signal processor is set to 2 (i.e., an effective amplitude is 50%).

The analog circuit section or weight generating unit 2 of FIG. 2 controls a plurality of built-in weight generating elements 20 in response to the combined digital signal processed output thus processed to generate an analog output signal representative of the digital input signal. Output 160 of DEM circuit 16A is produced on a plurality of conductors which are coupled to inputs of weighting element switches of the weight generating elements, if the weighting element switches are included within the weight generating elements 20. Alternatively, conductors 160 can be inputs for weight generating elements, if the weighting element switches are included in the DEM circuit 16A. (Subsequently described FIGS. 3A, 3B, 3C and 4 illustrate the weighting element switches referred to.)

FIG. 2 illustrates, as one example, a configuration of a digital-to-analog converter 100 which combines a segment conversion type digital signal processing scheme including a segment digital-to-analog-converter (SDAC) 12A and a ΔΣ conversion type digital signal processing scheme including a 5 level ΔΣ digital-to-analog converter 12B. The exemplary configuration illustrated in FIG. 2 includes the segment conversion type digital signal processor 12A for converting the upper six bits 11A (including MSB) of the 24 bit digital input word. SDAC 11A is a "segment conversion type digital decoder", which is a kind of "thermometer decoder".

The segment conversion is a scheme for producing an analog output level by preparing a number of segments expressed by an input subword and selecting the number of segments in accordance with the value of the input subword. The segment conversion is simple in configuration, and it is relatively easy to average segments to provide a highly accurate output.

However, as the number of bits of the input subword is increased, the number of segments is exponentially increased, so that the segment conversion is prohibitive for a number of "upper" input bits larger than a certain limit, for example 6 bits.

On the other hand, the ΔΣ conversion can reduce an output signal to a serial data stream that is one bit wide. However, the ΔΣ conversion is disadvantageous in that there is an increased noise level in a high frequency region and the delta sigma conversion is susceptible to jitter.

According to the present invention, by combining the two above described digital-to-analog conversion schemes, it is possible to implement a configuration which can make the most of their respective advantages. Specifically, the upper bits 11A are converted by the segment conversion SDAC 12A, which does not generate extra noise. The lower bits, which cannot be processed by the segment conversion scheme, are simultaneously converted by the 5 level ΔΣ digital-to-analog converter 12B.

For comparison with the present invention, assume a 20-bit digital-to-analog converter in accordance with a prior art scheme in which five upper bits are input to a segment converter, and the remaining lower bits are input to a ΔΣ converter. In this case, the number of segments in the segment converter may be 30. In addition, since the respective segments can be averaged by a proper averaging technique such as a "data weighted averaging method", a highly accurate output can be provided from the segment converter (a five-bit accuracy of the input can be sufficiently ensured). Also, even when a plurality of conversion segments are required in the ΔΣ converter, the averaging may be relied on to produce an output close to an ideal one. Further, since the five upper bits are processed by the segment conversion scheme, the accuracy of the ΔΣ converter needs to be only 16 bits. In this way, since both the converters can accomplish highly accurate outputs close to ideal ones, the two outputs can be combined to produce an output close to the ideal one for a 20-bit input.

Unfortunately, however, such a highly accurate output cannot be accomplished. Although the segment converter 12A and the ΔΣ converter 12B can respectively produce outputs close to ideal ones, the combination of the two outputs causes a problem. This problem of the prior art is caused by a difference between the respective "reference levels" of the segment converter 12A and the ΔΣ converter 12B. In a conventional DAC including two different conversion DAC units, each DAC has a respective "reference level" for DAC conversion elements. Because the reference levels are generated within the respective conversion circuits, the characteristics of the reference levels are strongly influenced by the electric nature of the circuit topology, such as stability against supply voltage changes, temperature dependence, etc. The term "reference level" refers to weighting which is set when the input digital signal 9 is divided into inputs of the respective converters 12A and 12B, and indicates a relative relation rather than an absolute value. Therefore, since the segment converter 12A converts upper bits 11A of the digital input 9 and the ΔΣ converter 12B converts lower bits 11B, the least significant bit (LSB) of the segment converter 12A must be completely equal to an analog output level at a full scale value (full scale plus LSB) of the ΔΣ converter 12B.

In practice, however, errors involved in the manufacturing are far larger than the required accuracy. In accordance with the present invention, segmented DAC elements therefore include equivalent circuit elements which are shared among different conversion decoders.

A key aspect of the present invention is that it provides a method of improving the relative accuracy of the converted output produced by multi-bit thermometer decoder SDAC 12A and the converted output produced by multi-level ΔΣ modulator 12B in FIG. 1. As previously discussed, each converter has one or a plurality of analog converting segments (or weight generating elements). The segments 20 for the respective converters 12A,B are provided with the same weight, and averaged by a proper averaging technique.

A key aspect of this architecture is the effective "sharing" of the same conversion elements, i.e., weighting elements, for two different conversion decoders at the digital-to-analog conversion stage 20, thermometer decoder 12A, and 5-level ΔΣ modulator 12B. The effective "sharing" of the same conversion elements is accomplished by the way in which the outputs of thermometer decoder 12A and ΔΣ modulator 12B are produced and summed by adder 14 to produce the signals on conductors 140. The effective sharing of the conversion elements results in reducing the error caused by the different reference levels and/or by the mutually identical or mutually different conversion schemes.

A variety of approaches for averaging a plurality of segments having the same weight have been contemplated and implemented. For example, when segments 20 having the same weight are used to configure the two converters 12A and 12B, the averaging can be readily performed, resulting in a higher relative accuracy between the converters. In the embodiment illustrated in FIG. 1, the single common weight generating unit 20 is comprised of 30 identical segments for the segment conversion unit, so that the weight generating elements for the ΔΣ conversion unit may be implemented by these segments. (Note that segments having different weights may be used as long as they can be averaged).

Dynamic element matching, which is a very well known technique, is the preferred averaging technique to be used in the DEM circuit 16A of digital signal processing unit 16, and a Data Weighted Averaging (DWA) method, which also is very well known, is the specifically preferred technique. The DWA technique is effective as a result since an error is suppressed by a first-order noise shaping method.

Implementation of divider unit 10 is straightforward. FIGS. 2, 3A, and 3B illustrate logic diagrams for various parallel input mode and serial input mode implementations of divider unit 10 of FIG. 2.

Referring to FIG. 3A, analog-to-digital converter 101 is a parallel input mode implementation of analog-to-digital converter 100 of FIG. 2. The digital input 9 is shown as a parallel 24-bit word, and data divider circuit 10 produces the upper six bits 11A and lower 18 bits and MSB as parallel words. SDAC 12A is shown in FIG. 2 as a thermometer decoder 12A. The thermometer decoder output 13A is shown as providing 63 discrete levels labeled 0–62 encoded as binary signals conducted by 6 conductors. Digital adder 14 provides 67 discrete levels labeled 0–66 encoded as binary signals conducted by 7 conductors 140. The output signals produced by dynamic element matching encoder 16A are provided on a suitable number of conductors 160 as inputs to weighting elements switches 18, so as to selectively connect dynamic weighting elements into the thermometer decoder 12A, $\Delta\Sigma$ modulator 12B, and current segment DAC 20A generally in accordance with the dynamic element matching techniques mentioned above.

FIG. 3B shows a variation 102 of the analog-to-digital converter 101 of FIG. 3A, wherein the input word is a 24-bit serial digital input word of serial-parallel converter 10A converts the serial input word to the 24-bit parallel word which is then applied to the input terminals of parallel data divider 10. FIG. 3C shows another variation in which a serial digital input word is applied to the input of a serial data divider circuit 10C which divides the serial digital input word into six upper serial bits 111A and a lower serial word including the MSB and lower 18 bits designated by reference numeral 111B. The upper and lower serial words 111A and 111B are applied to the inputs of serial-to-parallel converters 10D and 10E, respectively, to provide the parallel upper word 11A and parallel lower word 11B applied to the digital inputs of thermometer decoder 12A and $\Delta\Sigma$ modulator 12B, respectively.

Referring to FIG. 4, a segmented DAC topology 20A is illustrated wherein the inputs of weighting element switches 18 receive the signals produced by dynamic element matching encoder circuit 16A. The conductors 180-1, 180-2, . . . 180-M represent terminals of particular weighting elements 45 selected by the present state of dynamic element matching encoder 16A. In FIG. 4, the output signals 160 produced by dynamic element matching encoder 16A are applied to the control elements of weighting element switches 18-1,2 . . . M, of weighting element switch circuit 18. Each weighting element switch has one terminal connected to a reference voltage conductor 44 and another terminal connected to a first terminal of a corresponding current segment current source 45, respectively, of current segment circuit 19. Each of the preferably substantially equal current sources 45 has a second terminal coupled to output conductor 22 on which the analog output is produced.

Figure 6:
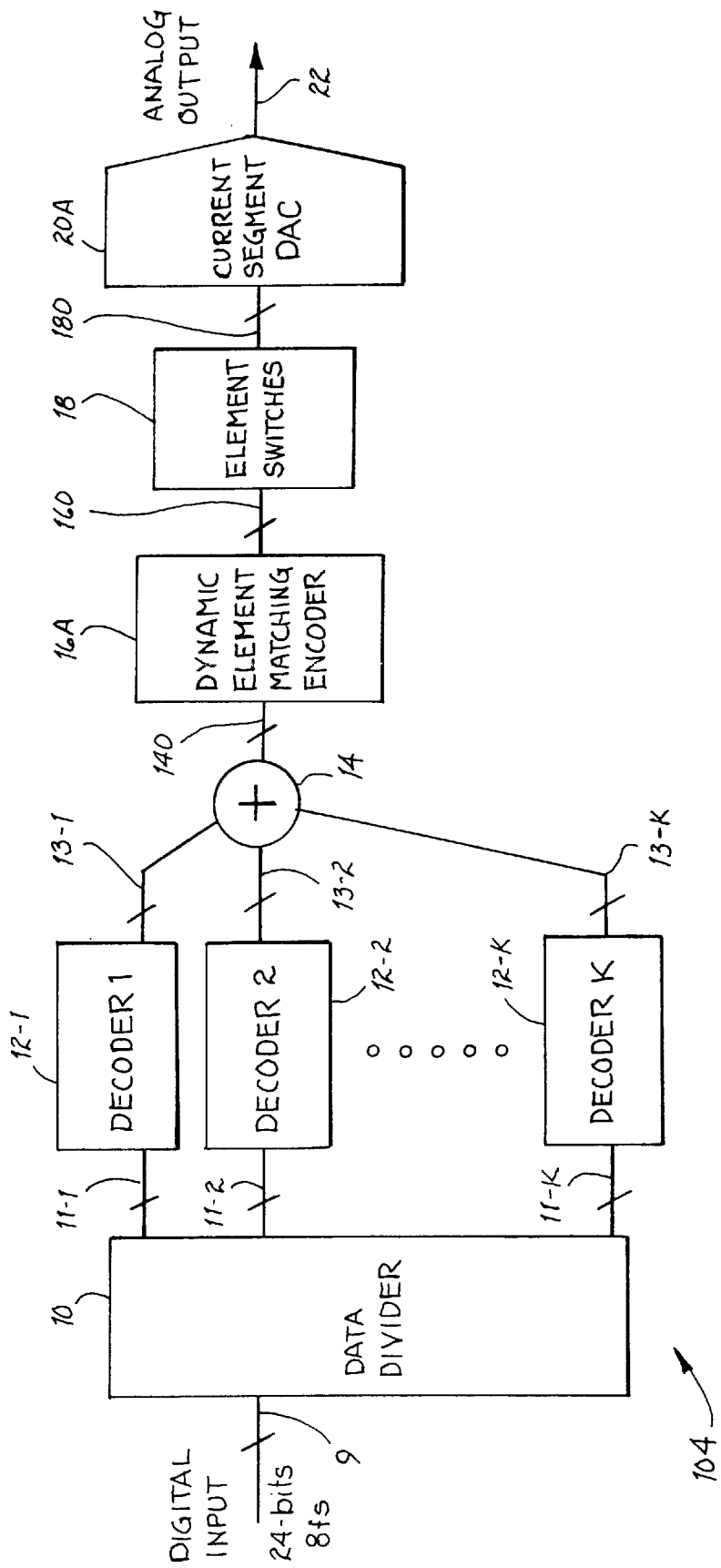
FIG. 6 is a block diagram of an implementation of the digital-toanalog converter of FIG. 2 having a parallel input mode topology, a dated divider which divides a parallel digital input word into K groups, and K decoders decoding the K groups, respectively.

FIG. 6 shows an alternative arrangement in which a 24-bit parallel digital input word 9 is converted by a data divider circuit 10 into K groups 11-1,2 . . . K, which are applied to the digital inputs of K decoders 12-1,2B . . . K, respectively. The outputs of decoders 12-1,2 . . . K are summed by a digital summing circuit 14 to produce the signals 140 applied to dynamic element matching encoder 16A.

Referring to FIG. 1, a more generalized implementation of the invention is disclosed, wherein the groups of data conductors 11-1,2 . . . K produced by data divider 10 are applied to the inputs of converters such as decoders 12-1,2 . . . K of FIG. 6, respectively, or to the inputs of converters such as SDAC 12A and 5 level $\Delta\Sigma$ modulator 122B of FIG. 2, which are referred to in FIG. 1 as "weight controllers" 12-1,2 . . . K, respectively, which perform data processing functions. The encoded outputs of weight controllers 12-1,2 . . . K are applied to corresponding inputs of "weight combination and encoding unit" 16,18, which adds and processes the data. The output 180 of weight combination and encoding unit 16,18 is applied to the input of weight generating unit 2A, which produces the analog output 22.

It will be appreciated from the foregoing description that the present invention can realize a high performance digital-to-analog converter which eliminates the need for trimming and so on that would result in a high cost.

What is claimed is:

1. A digital-to-analog converting method for generating an analog output signal using common weight generating element circuitry having a predetermined set of weights, comprising steps of:

receiving a plurality of weight generation control digital signals for controlling the common weight generating element circuitry;

digitally combining the plurality of weight generation control digital signals to provide a composite weight generation control digital signal; and controlling the common weight generating element circuitry in response to the composite weight generation control digital signal to generate an analog output signal corresponding to the combination of the plurality of weight generation control digital signals.

2. A digital-to-analog converting method according to claim 1, further comprising the step of generating the plurality of weight generation control digital signals from a plurality of digital signals, respectively, each of the plurality of digital signals being represented using a set of weights different from the predetermined set of weights.

3. A digital-to-analog converting method according to claim 2, further comprising the steps of:

receiving a digital input signal comprising a plurality of bits; and forming a plurality of bit groups from the plurality of bits of the digital input signal, the plurality of bit groups being used as the plurality of digital signals.

4. A digital-to-analog converting method according to claim 2, wherein the step of generating a plurality of weight generation control digital signals comprises using different digital-to-analog conversion type digital signal processing schemes in generating the weight generation control digital signals from the plurality of digital signals.

5. A digital-to-analog converting method according to any one of claims 1–4, wherein the step of digitally combining comprises digitally adding the plurality of weight generation control digital signals.

6. A digital-to-analog converter for providing an analog output signal using common weight generating element circuitry having a predetermined set of weights, comprising:

combining circuitry for receiving a plurality of weight generation control digital signals for controlling the common weight generating element circuitry, the combining circuitry being operative to digitally combine the plurality of weight generation control digital signals to provide a composite weight generation control digital signal; and weight generating circuitry including the common weight generating element circuitry and connected to receive the composite weight generation control digital signal from the combining circuitry, the weight generating circuitry being operative to control the common weight generating element circuitry in response to the composite weight generation control digital signal to generate an analog output signal corresponding to the combination of the plurality of weight generation control digital signals.

7. A digital-to-analog converter according to claim 6, further comprising:

a plurality of weight generation controlling circuitry for generating the plurality of weight generation control digital signals from a plurality of digital signals, respectively, each of the plurality of digital signals being represented using a set of weights different from the predetermined set of weights.

8. A digital-to-analog converter according to claim 7, further comprising dividing circuitry for forming, from a digital input signal comprising a plurality of bits, a plurality of bit groups as the plurality of digital signals.

9. A digital-to-analog converter according to claim 7, wherein the plurality of weight generation controlling circuitry use a plurality of different digital-to-analog conversion type digital signal processing schemes in generating the weight generation control digital signals from the plurality of digital signals.

10. A digital-to-analog converter according to any one of claims 6–9, wherein the combining circuitry performs digital addition as the digital combining.

11. A digital-to-analog converting method for generating an analog output signal representative of a received digital input signal comprised of a plurality of bits, the method comprising the steps of:

forming a plurality of bit groups from the plurality of bits of the digital input signal;

processing each of the plurality of bit groups using a predetermined digital-to-analog conversion type digital signal processing scheme to generate a weight generation control output, so that a plurality of weight generation control outputs are generated for the plurality of bit groups;

digitally combining the plurality of weight generation control outputs to generate a composite weight generation control output; and controlling a plurality of weight generating elements in response to the composite weight generation control output to generate an analog output signal representative of the digital input signal.

12. A digital-to-analog converting method according to claim 11, further comprising the step of digitally processing the composite weight generation control output.

13. A digital-to-analog converter for generating an analog output signal from a received digital input signal comprised of a plurality of bits, comprising:

dividing circuitry for forming the plurality of bits of the digital input signal into a plurality of bit groups;

a plurality of bit group weight generation control circuitry coupled to receive the plurality of bit groups, respectively, each of the plurality of weight generation control circuitry processing the bit group associated therewith using a predetermined digital-to-analog conversion type digital signal processing scheme to generate a weight generation control output, so that a plurality of the weight generation control outputs are generated;

adder circuitry for digitally adding the plurality of weight generation control outputs to generate a composite weight generation control output; and weight generating circuitry including a plurality of weight generating elements for controlling the plurality of weight generating elements in response to the composite weight generation control output to generate an analog output signal representative of the digital input signal.

14. A digital-to-analog converter according to claim 13, further comprising digital signal processing circuitry for digitally processing the composite weight generation control output.

15. A digital-to-analog converter for converting a digital signal to an analog signal, comprising:

a first digital signal processing unit for separating a digital signal input sequence weighted according to the digit by at least one or more arbitrary digits to produce K digital signal input sequences;

a second digital signal processing unit including a plurality of converters for digitally processing the K separated digital signal input sequences to convert the K separated digital signal input sequences to K second digital signal groups representative of levels of the K separated digital signal input sequences associated therewith;

a third digital signal processing unit for converting the K second digital signal groups to a third digital signal group representative of a level; and a group of digital-to-analog converting elements comprised of a plurality of N substantially equivalent weight generating elements for responding to an M-bit output of the third digital signal group representative of the level.

16. A digital-to-analog converter according to claim 15, wherein the group of analog-to-digital converting elements comprised of substantially equivalent weight generating elements for an M-bit output of the third digital signal group includes the number N of converting elements which is equal to or larger than M.

17. A digital-to-analog converter according to claim 16, wherein the third digital signal processing unit has a function of averaging the digital-to-analog converting elements with respect to a time axis.

18. A digital-to-analog converter according to claim 16, wherein the second digital signal processing unit for converting to K second digital signal groups includes at least one sigma-delta conversion digital signal processor.

* * * * *